United States Patent
Jain (10) Patent No.: US 7,118,980 B2
(45) Date of Patent: Oct. 10, 2006

(54) SOLID PHASE EPITAXY RECRYSTALLIZATION BY LASER ANNEALING

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/972,872

(22) Filed: Oct. 25, 2004

(65) Prior Publication Data
US 2006/0088969 A1 Apr. 27, 2006

(51) Int. Cl.
*H01L 21/336* (2006.01)
(52) U.S. Cl. ...................... 438/305; 438/530
(58) Field of Classification Search ........... 438/308, 438/530, 303, 305
See application file for complete search history.

(56) References Cited
U.S. PATENT DOCUMENTS 6,300,208 B1 * 10/2001 Talwar et al. ............... 438/308
6,391,731 B1 * 5/2002 Chong et al. ............... 438/303

* cited by examiner

*Primary Examiner*—Richard A. Booth
(74) *Attorney, Agent, or Firm*—Peter K. McLarty; W. James Brady, III; Frederick J. Telecky, Jr.

(57) ABSTRACT

Methods (70) are described for fabricating shallow and abrupt gradient drain extensions for MOS type transistors, in which a solid phase epitaxial recrystallization is performed within the drain extensions utilizing a laser SPER annealing process in the manufacture of semiconductor products. One method (70) includes a preamorphizing process (74) of implanting a heavy ion species such as Germanium deep into an extension region of a substrate adjacent a channel region of the substrate to form a deep amorphized region, then implanting boron or another such dopant species into an extension region of the substrate adjacent the channel region. The implanted dopant is then preannealed (78) at a low temperature to set the junction depth and doping concentration. The extensions and/or the deep source/drain regions are subsequently annealed (84) with a laser at a high temperature providing a solid phase epitaxial recrystallization in the regions proximate the channel region to achieve ultra high doping concentrations and activation levels with an abrupt gradient.

28 Claims, 10 Drawing Sheets

FROM 71 OF FIG. 3A
↓
PROVIDE A GATE STRUCTURE WITH AN OFFSET SPACER OVER A SUBSTRATE — 72
↓
TO 74 OF FIG. 3A

FIG. 3B

FROM 74 OF FIG. 3A
↓
OPTIONAL LT PREANNEAL TO RELAX AMORPHOUS STATE WITHOUT RECRYSTALLIZATION — 76
↓
TO 78 OF FIG. 3A

FIG. 3C

81 — FROM 78 OF FIG. 3A
↓
FORM A SIDEWALL SPACER AROUND THE GATE STRUCTURE — 82
↓
IMPLANT SOURCE/DRAIN REGIONS — 83
↓
TO 84 OF FIG. 3A

SOLID PHASE EPITAXY RECRYSTALLIZATION BY LASER ANNEALING

FIELD OF INVENTION

The present invention relates generally to semiconductor devices and more particularly to methods for performing a solid phase epitaxial recrystallization of the source and drain extensions of a transistor utilizing a laser annealing process in the manufacture of semiconductor products.

BACKGROUND OF THE INVENTION

MOS transistors are found in many modern semiconductor products where switching and/or amplification functions are needed. Many manufacturing processes and techniques have been developed for fabricating MOS devices in semiconductor substrate materials such as silicon and the like. In recent years, the size of transistors and other components have steadily decreased to submicron levels in order to facilitate higher device densities in semiconductor products. At the same time, many new applications have created a need to operate transistors and other semiconductor devices at lower power and voltage levels. Thus, whereas previous MOSFET devices were designed to operate at voltages of 5 or more volts, newer applications may require such devices to operate from DC supplies of around 3 volts down to about 1 volt. In addition, switching speed requirements of MOS transistors continue to increase in order to facilitate faster and improved product performance. Accordingly, efforts continue to be made to design semiconductor devices, such as MOSFET transistors, which occupy less physical space, consume less power, and operate at higher switching speeds and at lower voltages.

MOS transistors include a conductive gate overlying a channel region of the substrate with a thin gate dielectric, typically oxide, therebetween. Source and drain regions of the substrate (sometimes referred to as junction regions) are doped with impurities on opposite sides of the channel, wherein the source/drain regions of nMOS devices are doped with n-type impurities (e.g., As, Sb, P, etc.) and pMOS devices are doped using p-type impurities (e.g., B, Ga, In, etc.). The length of the gate structure overlying the channel is typically referred to as the physical channel length. The source and drain dopants are typically implanted into the silicon substrate using ion implantation systems, wherein the dosage and energy of the implanted ions may be varied depending upon the desired dopant concentration, depth, and profile. The ion dose generally controls the concentration of implanted ions for a given semiconductor material, and the energy level of the beam ions determines the distance of penetration or depth of the implanted ions (e.g., the junction depth).

Following implantation, the dopant atoms in the source/drain regions occupy interstitial positions in the substrate lattice, and the dopant atoms must be transferred to substitutional sites to become electrically active. This process is sometimes referred to as "activation", and is accomplished by high temperature annealing in an inert ambient such as argon. The activation anneal process also causes diffusion of implanted dopant species downward and laterally in the substrate, wherein the effective channel length becomes less than the physical channel length. As device sizes continue to shrink, the physical and effective channel lengths continue to be scaled downward, wherein short channel effects become significant.

In addition to short channel effects, hot carrier effects are also experienced in short channel devices. For example, during saturation operation of a MOS transistor, electric fields are established near the lateral junction of the drain and channel regions. This field causes channel electrons to gain kinetic energy and become "hot". Some of these hot electrons traveling to the drain are injected into the thin gate dielectric proximate the drain junction. The injected hot carriers, in turn, often lead to undesired degradation of the MOS device operating parameters, such as a shift in threshold voltage, changed transconductance, changed drive current/drain current exchange, and device instability.

To combat channel hot carrier effects, drain extension regions are commonly formed in the substrate, which are variously referred to as, for example, double diffused drains (DDD), lightly doped drains (LDD), and moderately doped drains (MDD). These drain extension regions absorb some of the potential into the drain and away from the drain/channel interface, thereby reducing channel hot carriers and the adverse performance degradation associated therewith. Referring to prior art FIG. 1, a conventional transistor fabrication process 2 is illustrated beginning at 4, wherein isolation structures are formed in a substrate at 6, and a gate oxide (e.g., gate dielectric) is formed at 8. At 10, a layer of polysilicon is deposited over the gate oxide, and is then patterned at 12 to form a polysilicon gate structure.

Figure 1:
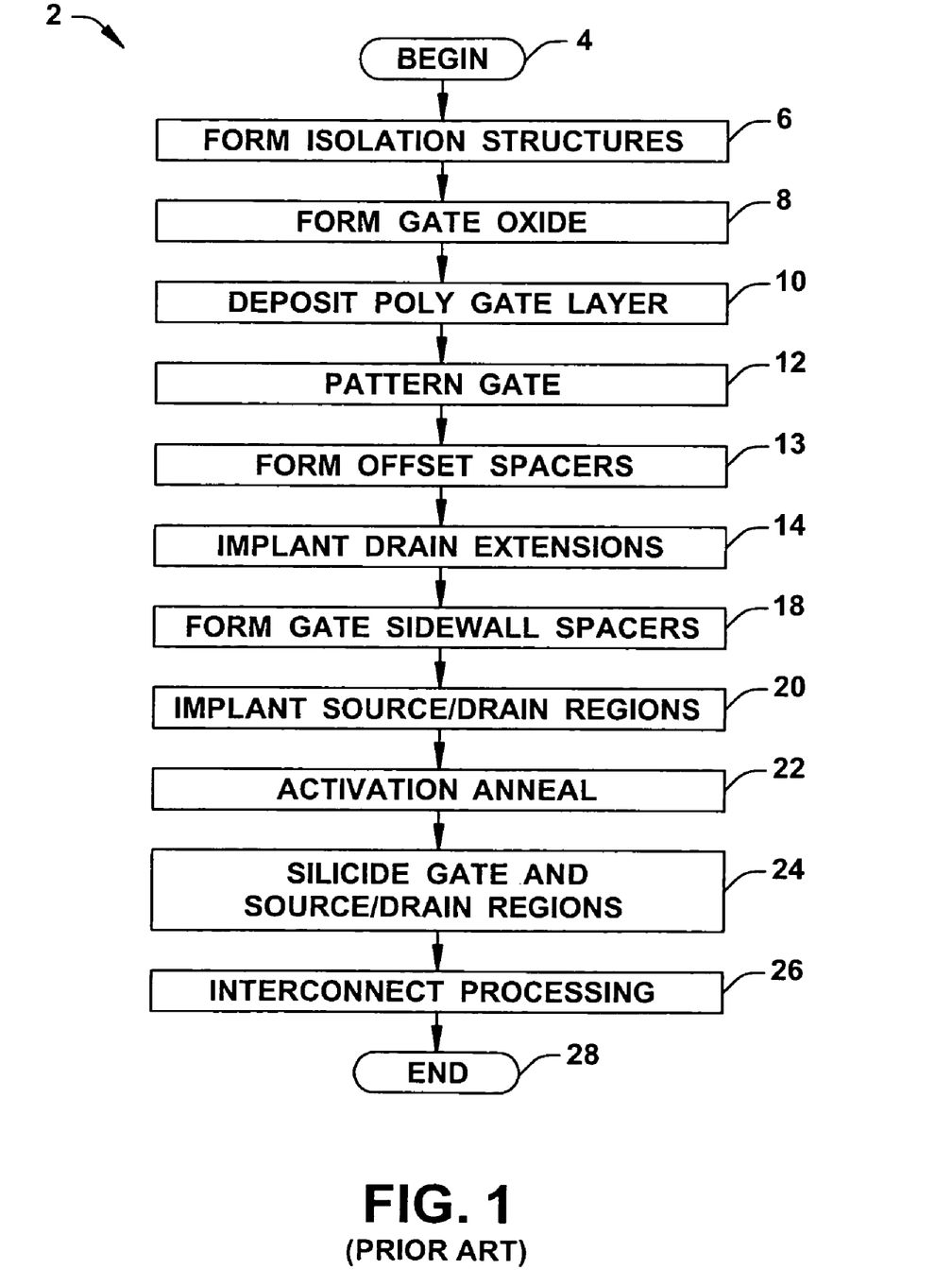
FIG. 1 is a flow diagram illustrating a conventional manufacturing process for fabricating MOS transistors having drain extension regions.

Offset spacers may optionally be formed on either side of the gate structure at 13 to guide an implant that is performed at 14, wherein drain extension regions are implanted. Typically, the LDD implant at 14 is a fairly low concentration dopant implantation process, which may also use the edge of the patterned gate structure as an implantation mask, while for MDD implantations the use of the offset spacers provided at 13 may be advantageous. Spacers are then formed at 18 along the sidewalls of the gate structure, and a second implantation (e.g., sometimes called a "source/drain implant") is performed at 20 using a higher dopant concentration and implantation energy to form the source/drain junction regions.

An activation anneal is then performed at about 1050 degrees C. at 22 to activate the implanted dopant in the drain extensions and the source/drain regions, and also to cause diffusion or migration of dopant downward and laterally in the silicon. Thus, drain extension regions and source/drain regions are provided, which partially overlap one another in the substrate. Typically, the drain extension regions extend downward to a somewhat shallow depth and laterally to or under the gate structure, whereas the deeper source/drain regions are laterally spaced from the gate (e.g., by about the sidewall spacer width). The gate and source/drain regions are then silicided at 24 and back-end interconnect processing is performed at 26 before the method 2 ends at 28.

As a result of the two implantations at 14 and 20, a dopant gradient is established across the junction from the source/drain region of the junction to the drain extension region adjacent the channel, sometimes referred to as a graded junction. The drain extension region operates to assume a substantial portion of the entire voltage drop associated with saturation operation at the drain junction, while the more heavily doped source/drain region forms a low resistivity region suitable for enhanced contact conductivity. Further, the source/drain dose is implanted at a higher energy to produce deeper source/drain junctions (deeper than the extension regions) and thereby to provide better protection against junction spiking.

As CMOS devices are scaled down to support future technologies, it has become increasingly problematic to proportionately scale down the depth and gradient of source/drain extension regions. As a result in part, lightly doped drain LDD extensions have recently given way to moderately doped MDD and highly doped drain extensions HDD, wherein the drain extension depths are becoming smaller (e.g., shallower). The recent trend is toward shallower junctions with lower sheet resistance, wherein reducing sheet resistance facilitates higher drive currents (e.g., improved threshold voltage transistor performance), and faster switching times. Shallower junctions reduce short channel effects, facilitating continuing efforts at scaling MOS transistors to smaller and smaller dimensions, both lateral and vertical scaling.

After implantation of such drain extension regions, prior art annealing has been carried out at low temperatures (e.g., <600° C.) for a substantial period of time, leaving behind considerable end-of-range damage to the crystal lattice boundaries. Prior attempts to anneal out this damage using subsequent anneals in conventional apparatus may result in profile degradation (e.g., loss of dopant gradient abruptness).

The amount of dopant activation in the drain extensions plays a role in determining the sheet resistance thereof, wherein increasing the dopant activation (e.g., lowering the sheet resistance) serves to lower parasitic resistance within the source to drain path. Thus, there is a need for fabrication techniques for MOS type transistors, by which improved epitaxial recrystalization of the source and drain extensions can be facilitated in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for MOS transistor fabrication, by which improved solid phase epitaxial recrystallization (SPER) of the source and drain extensions may be achieved in both nMOS and pMOS type devices.

In one aspect of the invention, a heavy ion species (e.g., Ge, In, Sb, As, P, BF2, Si, Xe, Ar, or another amorphizing ion) is implanted deep into a drain extension region of the substrate adjacent the channel via a preamorphization process. As used herein, the term drain extension includes extension regions associated with transistor drains as well as those associated with transistor sources. Subsequently, a dopant species, for example, boron for pMOS devices, is implanted into a drain extension region of the amorphized substrate (e.g., silicon substrate) adjacent the channel via a dopant implantation process.

Then, during a low temperature (LT) preanneal (Pre-SPER) of the dopant in the drain extension region, dopant is allowed to diffuse some to achieve an ideal or desired depth, dopant concentration, as well as some beneficial lateral diffusion under the channel region. The LT preanneal process is maintained at a temperature below the recrystallization temperature, for example, less than about 600° C. (e.g., about 550° C.) for a silicon substrate. Due to the concentration enhanced nature of the diffusivity of boron in silicon in the amorphous phase, it is possible to increase the junction gradient during these implantation and annealing processes according to one exemplary aspect of the invention. Finally, a laser SPER anneal (e.g., an ultra-fast flash anneal, <1 ms) provides an epitaxial recrystallization of the drain extensions while still in the solid phase.

In one aspect of the present invention, the laser SPER anneal may be used immediately after the implantation and low temperature preannealing of the drain extensions or after the implantation of the deep source/drain regions to provide a solid phase epitaxial recrystallization of the extension region or both regions, and the deep source and drain regions. In either case, however, the laser SPER anneal follows the pre-annealing process to balance the desired level of dopant diffusion depth and concentration.

In another aspect of the present invention, the laser SPER anneal may be used immediately after the implantation and low temperature pre-annealing of the drain extensions and after the implantation of the deep source/drain regions to provide a solid phase epitaxial recrystallization of the extension region and the deep source and drain regions.

In still another aspect of the invention, the laser SPER anneal is processed at a temperature of about 1350° C. (e.g., 1200–1400° C.) or less for about a millisecond.

In yet another aspect of the present invention, the deep preamorphization process may be integrated together with the dopant implantation process.

In one PMOS implementation, for example, a species of dopant is implanted, wherein the dopant is B (boron) or $BF_2$ (boron difluoride), or another dopant species that exhibits an enhanced diffusion property in the amorphous phase.

In an nMOS implantation example, a dopant species is used that exhibits an enhanced diffusion property in the amorphous phase.

In the past, solid phase epitaxy has been carried out at low temperatures (e.g., <600° C.), leaving behind considerable end of range damage, including clusters of interstitial Si atoms. Subsequent attempts to anneal out this damage using conventional anneal apparatus has resulted in profile degradation, wherein the profile is less abrupt than that which may be achieved in the present invention. In addition, some aspects of the present invention have further been found to provide significant improvement in reducing sheet resistance compared with prior methods, such as illustrated in prior art FIG. 1 above. The processes, moreover, may advantageously achieve higher activation levels and doping concentrations throughout substantially all of the drain extension region adjacent the channel region than that of some prior art technologies.

The formation of the source/drain regions may be integrated into this process, for example, wherein gate sidewall spacers are formed before the source/drain implant process is performed (e.g., B) using the sidewall spacers as an implantation mask. In an example of the disposable spacer approach, after the deep S/D region and poly is formed, the sidewall spacers are removed before the preamorphization implant and the dopant implant into the drain extensions. This scheme provides the opportunity to treat the deep S/D region regions to an extra thermal cycle (e.g., a conventional anneal), without affecting the extension regions. Thereafter, the LT preanneal is performed followed by the laser SPER anneal process to concurrently form the epitaxy and activate the dopants in the source/drain regions as well as the dopant species in the drain extension regions.

In another implementation, the sidewall spacers are formed, the source/drain implant is performed, and the sidewall spacers are removed prior to the preamorphization and implanting the dopant species in the drain extensions.

In this implementation, the preanneal process may be employed to concurrently provide the desired amount of diffusion in the dopants in the source/drain regions and the drain extension regions, after which the laser SPER anneal is performed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention provides new processes for forming drain extension regions in the manufacture of transistor devices, wherein a deep preamorphized region is produced in the drain extensions, which are implanted with a dopant exhibiting an enhanced diffusion property in the amorphous phase. The dopant is then pre-annealed to set the junction depth, and laser annealed to facilitate a higher activation level and an abrupt gradient profile for shallow junction depths. Exemplary implementations are hereinafter illustrated and described in the context of fabricating pMOS transistors with a B or $BF_2$ drain extension dopant implantation and anneal, wherein the structures illustrated are not necessarily drawn to scale. However, it will be appreciated that the invention may be employed separately or in combination in forming drain extensions in nMOS transistors using suitable dopants exhibiting an enhanced diffusion property in the amorphous phase, as well as in fabricating other devices apart from the exemplary structures illustrated herein. These and other benefits will become more apparent as the following figures are described.

As indicated previously, while CMOS devices are being scaled down to support future technologies, it has become increasingly problematic to proportionately scale down the depth and gradient of drain extension regions. Some of these problems and issues will become more apparent in light of a prior art method that has been used for forming transistor source/drain extension regions in a semiconductor device.

Figure 2:
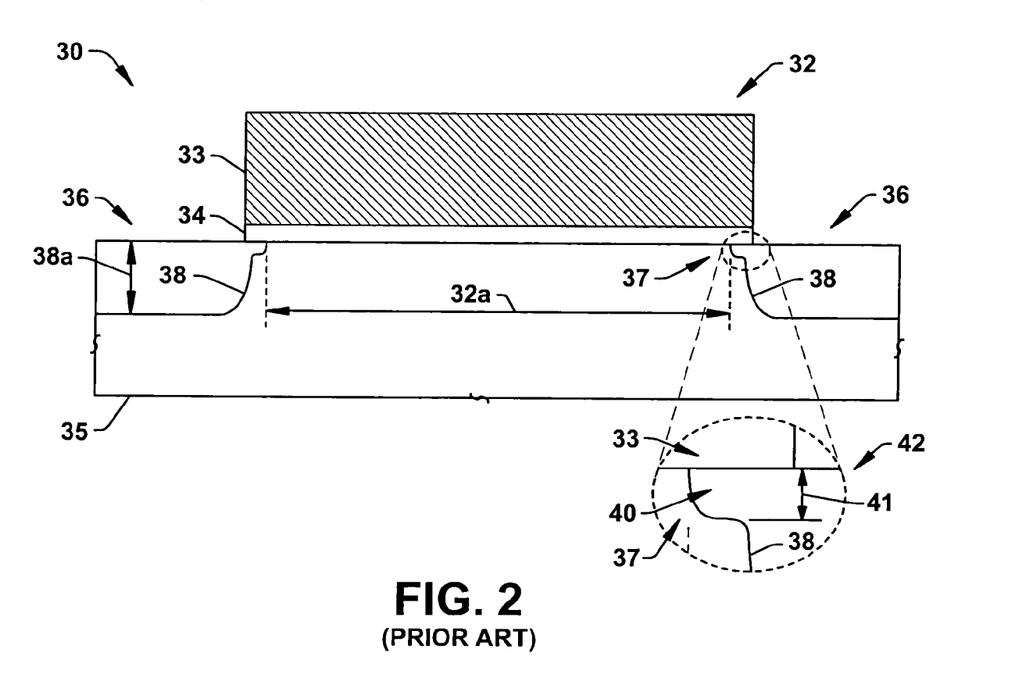
FIG. 2 is a partial cross-sectional side view of a prior art MOS transistor illustrating a source/drain profile and further detailing a drain extension or "tail" formed with a semiconductor substrate.

FIG. 2, for example, illustrates a profile for a conventional MOS transistor utilizing a drain extension or "tail" and one or more problems associated with the reduction in scale of a transistor. The MOS transistor 30 comprises a gate structure 32 having a channel length 32a, a polysilicon material layer 33 formed overlying a gate-oxide layer 34, formed overlying a semiconductor substrate 35 wherein source/drain regions 36 reside on either side of a channel region 37. In the conventional MOS transistor 30, a deep source/drain junction 38 having a depth 38a is typically formed alongside a gate structure by implantation. The S/D region 36 has a drain extension or "tail" 40 with depth 41, extending into and underlying the gate 32 and gate channel area 37. An enlarged detail 42 further illustrates the area surrounding the drain extension tail 40, and the manner in which the drain extension shortens the effective channel length by comparison to a transistor without this drain extension tail feature 40.

In the fabrication process of the conventional MOS transistor 30 of FIG. 2, isolation structures (not shown) are formed in the substrate 35, and the gate oxide 34 (e.g., gate dielectric) is formed. The layer of polysilicon 33 is deposited over the gate oxide 34, and is then patterned to form the polysilicon gate structure 32. Subsequently, an LDD implant is performed, wherein drain extension regions 40 are implanted using (e.g., As). Note that this method is generally limited to the low dose levels of the LDD implant without offset or side wall spacers.

Since the drain extension depth 41 is relatively small by comparison to the channel length 32a and to a number of other features of the MOS transistor 30, the drain extension depth 41 tends to become a more difficult feature to scale down with the remainder of the transistor 30. Further, there is a desire for the dopant gradient, or rate of change in dopant concentration downward through the depth of the drain extension, to become increasingly sharp or abrupt in terms of the profile of the dopant gradient, to keep pace with transistor scaling.

The inventor of the present invention has realized that the goals for semiconductor processing in the drain extension area, face two opposing goals; to form a highly graded (abrupt) dopant profile extension that is as shallow as possible, and also to allow sufficient dopant diffusion near and slightly under the channel region, in part for the reasons previously stated. Although conventional thermal annealing is slow, it adequately supplies the needed diffusion of the dopant after implantation. However, in one example, upon subsequent deep source/drain implant with common MDD and HDD materials, a fast or flash anneal is desirable to stop or prevent further unwanted diffusion from degrading the "steepness" or abruptness of the dopant profile. Careful time and temperature studies are often needed to maintain control of the processing results.

Recent developments in lasers suitable for semiconductor annealing purposes have provided another solution where ultra-fast annealing is desirable, while at the same time presenting another problem. Laser annealing is capable of ultra high temperatures (UHT) in the range of, for example, about 1100° C. to 1400° C. achieving the annealing process in approximately one millisecond (1 ms) or less. At these temperatures produced by the laser, epitaxial recrystallization takes place in the silicon substrate while it is still in the solid phase or SPER. The problem presented by these laser temperatures and times, however, in the case of the drain extension, is that diffusion within the extension is essentially halted in that millisecond. Therefore, such UHT laser annealing tends to disadvantageously limit the dopant diffusion in those regions exposed to the laser.

In response to these seemingly opposing goals and problems, the present invention is presented. One aspect of the invention provides methods for fabricating one or more MOS transistors in a wafer, which comprise implanting a heavy ion species or neutral ion species, such as Ge (Germanium), In, Sb, As, P, $BF_2$, or another amorphizing ion), deep into a drain extension region of the substrate adjacent the channel region to form a deep amorphized region in the silicon using a preamorphizing process. The amorphized silicon is then implanted with a dopant species such as B (boron) or $BF_2$ (boron difluoride) for pMOS devices, or another dopant species that exhibits an enhanced diffusion property in the amorphous phase, using a dopant implantation process.

The dopant implanted in the drain extension is then preannealed (Pre-SPER) at a low temperature (LT) to allow some diffusion downward to achieve an ideal dopant concentration and depth, and laterally for some beneficial diffusion under the channel region, using an LT preanneal process. The LT preanneal process is maintained at a temperature below the recrystallization temperature of a silicon substrate, for example, less than about 600° C. (e.g., about 550° C.). Finally, a laser SPER anneal (e.g., an ultra-fast flash anneal, <1 ms) provides a solid phase epitaxial recrystallization (SPER) of the drain extensions.

One such method 70 is illustrated in FIGS. 3A thru 3D, representing several variations of the method for fabricating an MOS transistor in accordance with several aspects of the present invention. Although the exemplary method 70 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and transistor devices illustrated and described herein as well as in association with other apparatus and structures not illustrated.

Method 70 comprises an exemplary solid phase epitaxy by laser annealing process that may be used in the fabrication of one or more MOS transistors in a wafer, the method beginning at 71. A MOS transistor may be provided at 72 of FIG. 3B, for example, for receiving the epitaxial growth and annealing. The transistor may have a gate structure previously formed with an offset spacer along side the gate and overlying a silicon substrate.

Returning to FIG. 3A, either separately, or combined in one step as shown at 74, the drain extension regions are preamorphized and implanted with, for example, an MDD material layer. For example, the preamorphization may be accomplished by the ion implantation of a heavy ion species or neutral ion species, such as Ge (Germanium), In, Sb, As, P, $BF_2$, or another amorphizing ion). The amorphizing ions of the preamorphizing process are implanted deep into the drain extension region of the substrate adjacent the channel region with sufficient energy to form a deep amorphized region in the silicon. The preamorphizing heavy ion implantation at 74 comprises, for example, an implantation dose of about 5E13 to 5E15 Ge/$cm^2$, such as about 8E13 to 5E15 Ge/$cm^2$, preferably about 2E14 Ge/$cm^2$. The heavy ion drain extension implant at 74, moreover, employs an implantation energy of, for example, about 50 keV to about 100 keV, such as about 45–80 keV, preferably about 70 keV.

Figure 3A:
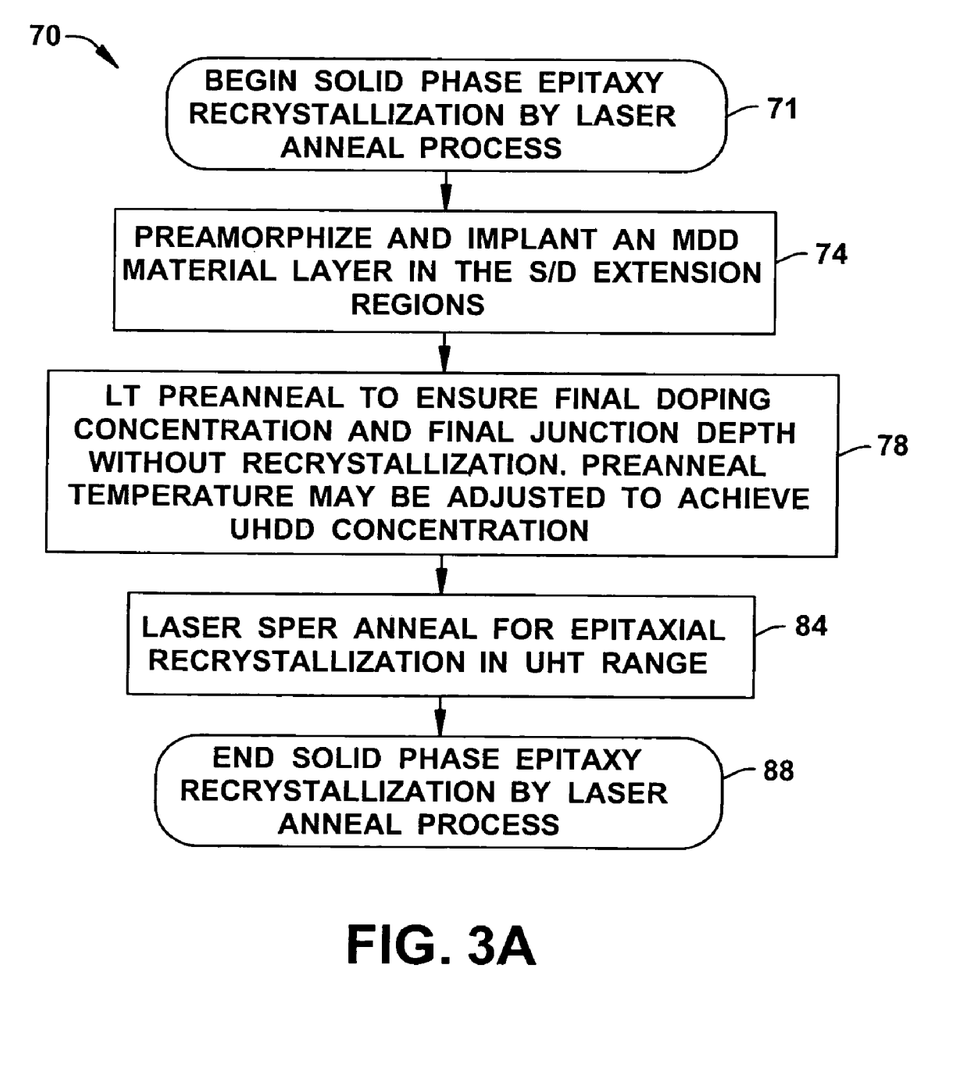
FIGS. 3A–3D provide flow diagrams illustrating an exemplary method of fabricating a drain extension in a MOS transistor in a wafer in accordance with one or more aspects of the present invention.
Figure 3B:
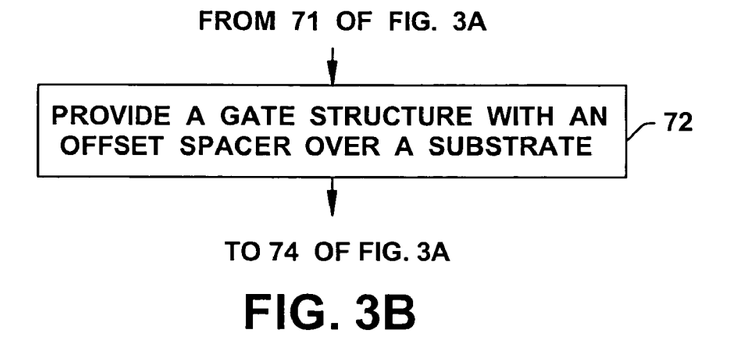

The amorphized silicon is also (subsequently, or concurrently with the preamorphization step) implanted in the drain extension region with a dopant species such as B (boron) or $BF_2$ (boron difluoride) for pMOS devices, for example, or another dopant species that exhibits an enhanced diffusion property in the amorphous phase, using a dopant implantation process at 74. The dopant implantation at 74 comprises an implantation dose of, for example, about 5E13 to 8E15 $BF_2$/$cm^2$, such as about 1E14 to 4E15 $BF_2$/$cm^2$, preferably about 1.4E15 $BF_2$/$cm^2$. The drain extension implant at 74, moreover, employs an implantation energy of, for example, about 0.5 keV to about 10 keV, such as about 1–5 keV, preferably about 3 keV. If boron is used, the dose may be about 1E14 to about 4E15 B/$cm^2$, and an implantation energy of about 0.2 keV to about 2 keV, for example.

The inventor of the present invention has realized that boron or $BF_2$ and other such dopant species have a special property in regard to diffusivity. Boron exhibits a diffusion enhancing property when implanted in silicon in the amorphous phase. In particular, B or $BF_2$ has been observed to have a concentration enhanced diffusion property, wherein the diffusion of boron in amorphous silicon is a function of the dopant concentration, the gradient, and the base diffusivity of B or $BF_2$. It has been observed that an increase in the dopant concentration of boron produces a corresponding increase in the diffusion of boron that may be useful to increase the gradient profile attainable in a drain extension. Thus, at least in the case of PMOS devices, this enhanced diffusion property permits B or $BF_2$ to be utilized to form ultra-highly doped drain (UHDD) regions suitable for ultrathin drain extensions having a lower sheet resistance.

Following implantation, the B or $BF_2$ atoms occupy interstitial positions in the substrate lattice in the drain extension region (e.g., as well as in the source/drain regions), and are then activated through annealing discussed infra.

Figure 3C:
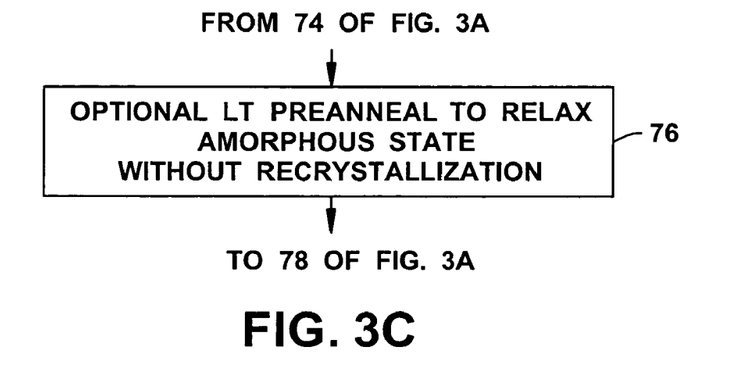

Optionally, at 76 of FIG. 3C, the dopant (e.g., boron) implanted in the drain extension may then be preannealed at a low temperature (LT) to provide some relaxation of the amorphous state in the silicon. This optional or first LT preanneal process is maintained at a temperature below the recrystallization temperature of the silicon substrate, for example, between about 400° C. to about 600° C. (e.g., preferably between about 450° C. to about 550° C.) for about 2 seconds to about 2 hours, and preferably about one hour. The optional or first LT preanneal process is used to provide a higher active concentration of boron, which further lowers the sheet resistance of the extension regions.

At 78 of FIG. 3A, the dopant (e.g., boron) implanted in the drain extension is then preannealed (Pre-SPER) at a low temperature to allow some diffusion downward to achieve an ideal dopant concentration and depth, and some diffusion laterally under the channel region, using an LT preanneal process (or second LT preanneal when the optional first LT preanneal is used). This LT preanneal (or second LT preanneal) is maintained at a temperature below the recrystallization temperature of the silicon substrate, for example, about 500–600° C. for about 30 minutes or less.

Finally, a laser SPER anneal (e.g., an ultra-fast flash anneal, <1 ms) at 84 of FIG. 3A provides a solid phase epitaxial recrystallization (SPER) of the drain extensions. For example, the laser SPER anneal occurs at a temperature between about 1200° C. to about 1400° C., preferably about 1300° C. to about 1350° C. for about 1 ms or less.

Figure 3D:
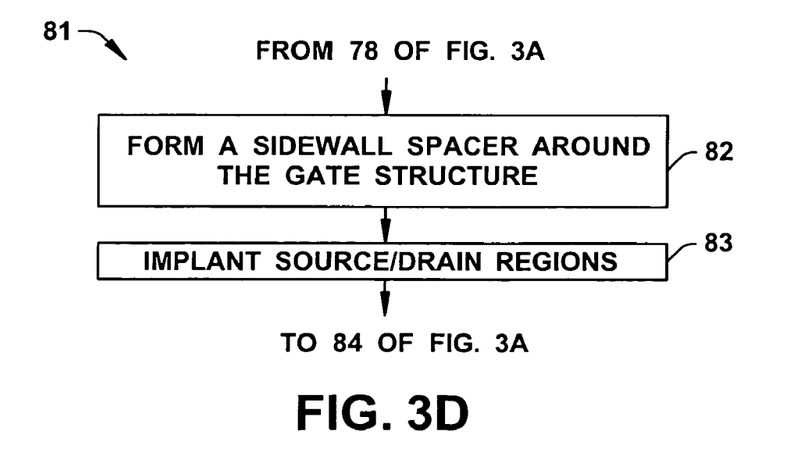

Optionally, at 81 of FIG. 3D, before the laser SPER anneal 84, a side wall (SNV) spacer may be formed on either side of the gate structure at 82 to aid in the implantation of the deep source and drain (S/D) regions at 83. This allows the annealing of the extensions and the deep S/D to take place concurrently, as may be desired.

Finally the exemplary method 70 ends at 88, and subsequent conventional back-end processing may be provided.

Figure 4:
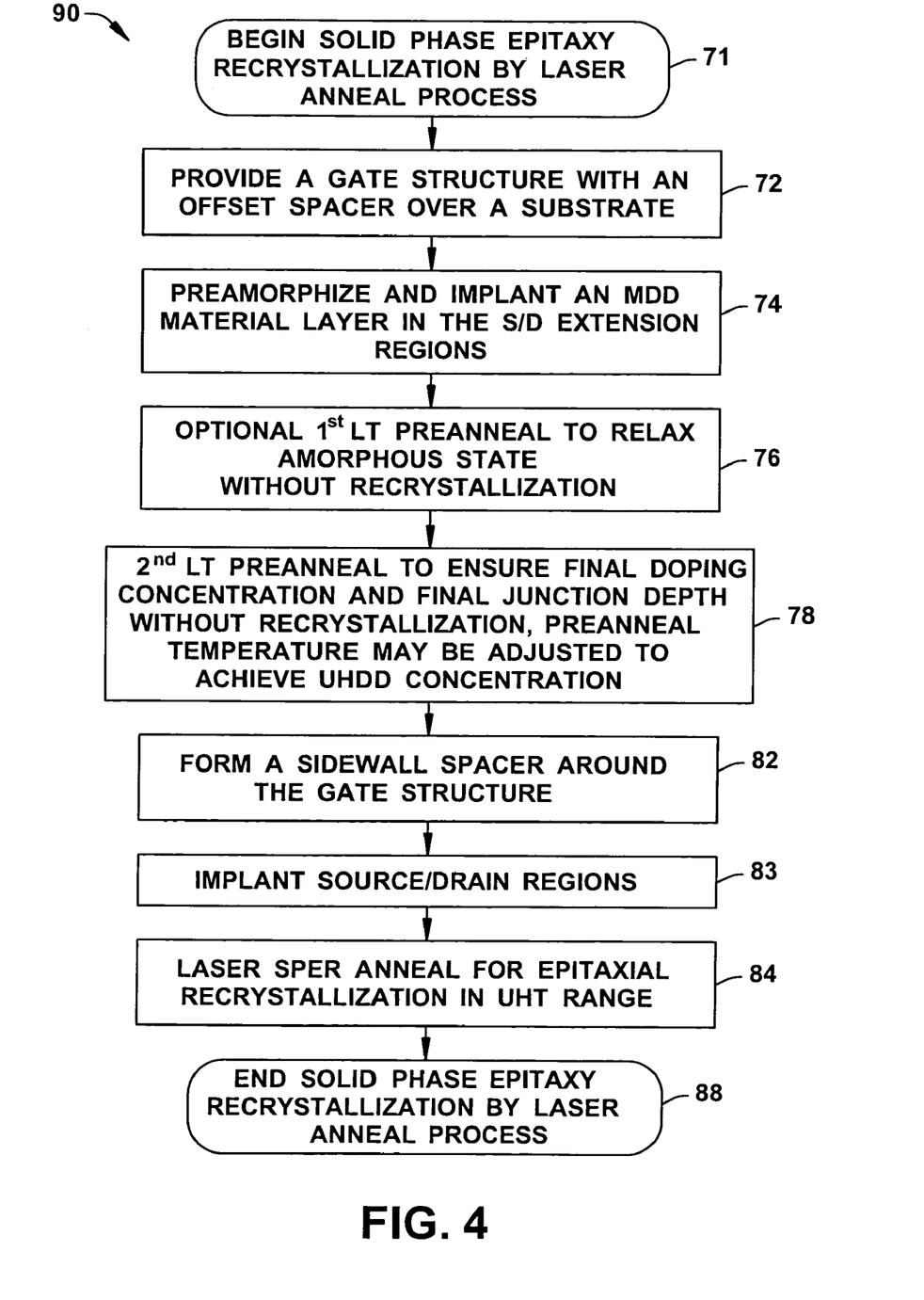
FIGS. 4 and 5 are flow diagrams illustrating an exemplary method of fabricating a drain extension in a MOS transistor in a wafer in accordance with one or more aspects of the present invention.
Figure 5:
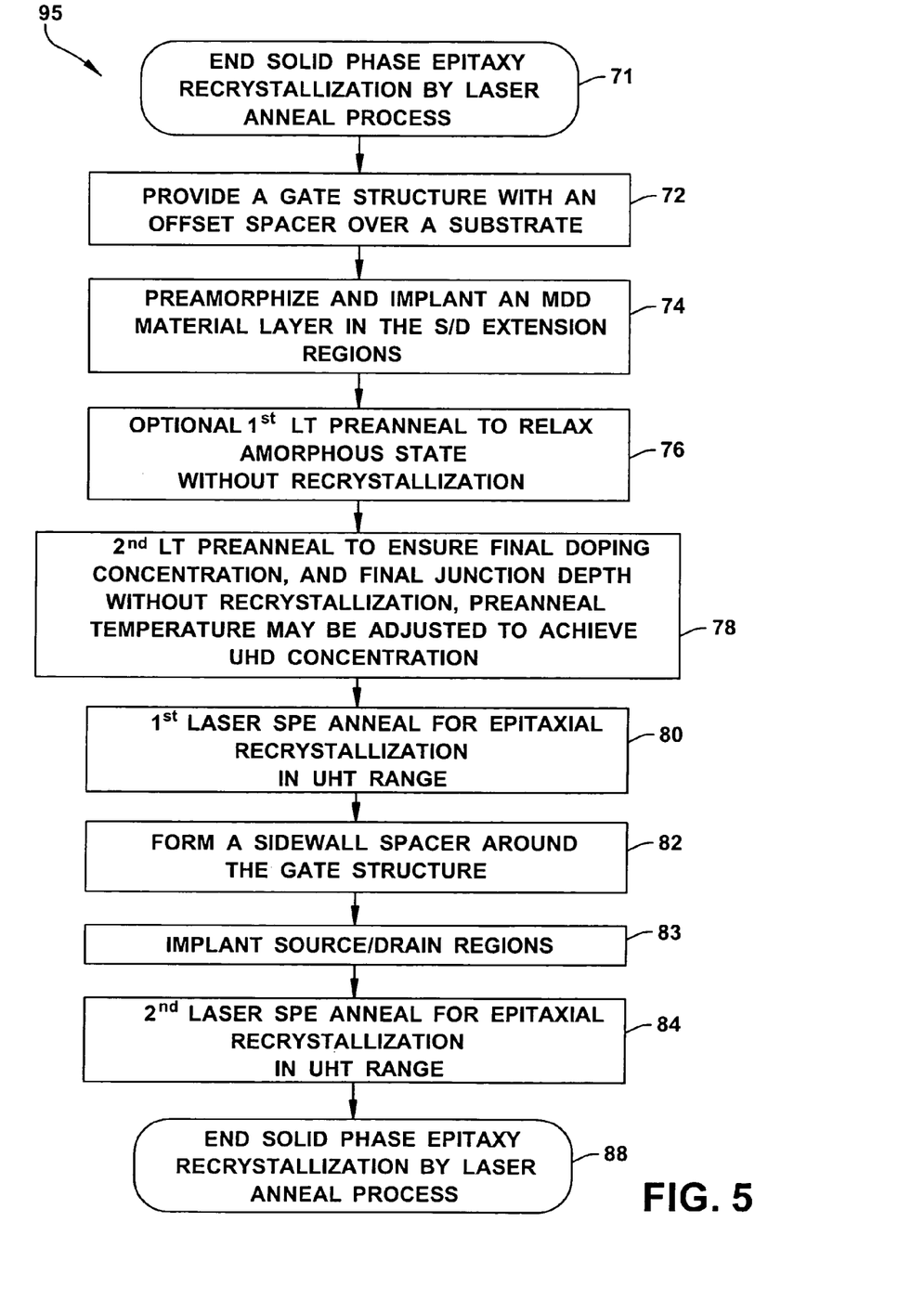

FIGS. 4 and 5 illustrate other variations of the solid phase epitaxy by laser anneal method 90 and 95, respectively, similar to the method 70 of FIGS. 3A–3D, and as such need not be fully described again for the sake of brevity. Accordingly, methods 90 and 95 illustrate the use of the preamorphization and implant process 74, the LT preanneal process 78, and the laser SPER anneal 84, in exemplary processing implementations in combination with a variety of other steps and/or an additional laser SPER anneal step.

For example, FIG. 4 illustrates an exemplary method 90 of fabricating a drain extension in a MOS transistor in a wafer in accordance with one or more aspects of the present invention, in a preferred ordering implementation utilizing the collective acts of FIGS. 3A–3D. Method 90 illustrates the LT preanneal process as comprising a first and second preanneal 76 and 78, respectively. Method 90 further illustrates the final laser SPER anneal 84 concurrently annealing the drain extensions and the deep source/drain regions to accommodate the least departure from conventional process methods. Although the anneal process is performed concurrently to activate and anneal the implanted dopants in the source/drain regions and those in the drain extension regions, other processes are contemplated within the scope of the present invention, wherein a separate anneal may be performed for the source/drain regions.

This laser SPER anneal process at 84 may be performed, for example, in an inert ambient such as N (nitrogen) and/or Ar (argon), at a peak temperature for about 5 ms or less, such as about 1 ms, although any appropriate time-temperature anneal process characteristic may be employed.

FIG. 5 further illustrates another exemplary method 95 of fabricating a drain extension in a MOS transistor in accordance with the present invention similar to that of FIG. 4. Method 95 illustrates all the steps of FIG. 4 with the addition of an optional first and second laser SPER anneal, 80 and 84 respectively. The second laser SPER anneal 84 is used as before, whereas the first laser SPER anneal 80 is used to perform an epitaxial re-growth or recrystallization within the drain extension before the deep source and drain regions are implanted. Although this may seem an unnecessary extra laser anneal, it may be desirable to bring to a halt a localized diffusion, for example, while other intervening processes are accomplished, either by those illustrated or others not illustrated.

Note that the LT preanneal 78 also causes diffusion of implanted B or $BF_2$ downward and laterally in the substrate, wherein the effective channel length become less than the physical channel length. Thus, in the illustrated example, the drain extension regions may extend laterally under the gate structure and downward to a final drain extension junction depth after the anneal at 78.

Figure 6A:
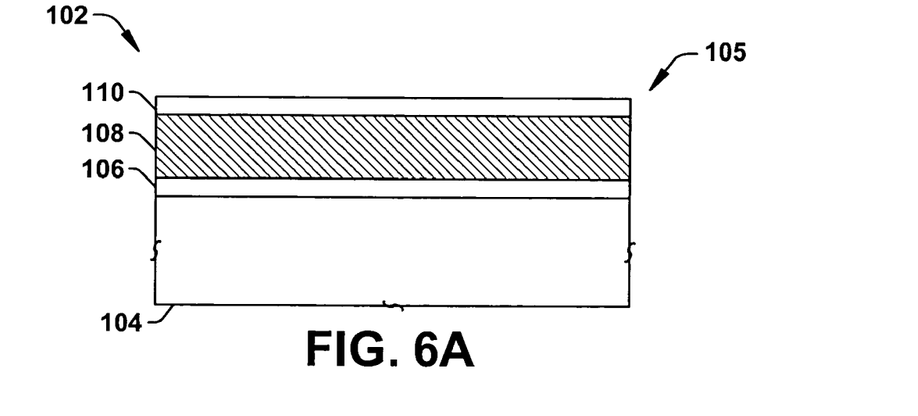
FIGS. 6A–6F are partial side elevation views in section illustrating an exemplary pMOS transistor at an intermediate stage of processing following formation of a patterned gate structure, offset spacer, and sidewall spacer overlying a gate oxide and a substrate.

It will be appreciated that the implantations and anneals of the illustrated example, as well as others in accordance with the invention, may provide profiled dopant concentrations, wherein peak concentrations occur at a certain depth, and where lower concentrations are found at other depths within the drain extension regions. Thus, the peak concentration depth may, but need not coincide with the maximum depth of implanted/diffused dopants within the drain extension regions. Further, while various implementations of the invention provide for generally similar concentrations of different dopant species within the drain extension regions, these concentrations may both be profiled, having peak concentrations at different depths therein, as illustrated and described further below with respect to FIG. 6.

Referring now to FIGS. 6A–6K, an exemplary pMOS transistor 102 is illustrated undergoing semiconductor fabrication processing in accordance with the invention, wherein the device 102 is not necessarily drawn to scale. In FIG. 6A, the transistor device 102 is illustrated at an intermediate stage of fabrication processing of a semiconductor device, wherein the MOS transistor 102 has been formed on or in a semiconductor substrate 104, such as silicon or silicon-germanium.

Initially in FIG. 6A, the MOS transistor 102 comprises multiple layers of material which comprise a gate stack 105, which is formed over the semiconductor substrate 104. The exemplary layers of the gate stack 105 comprise a gate-oxide material layer 106 formed over the semiconductor substrate 104, a polysilicon material layer 108 formed over the gate-oxide layer 106, and a hard mask layer 110 comprising, for example, an oxynitride material formed overlying the polysilicon material layer 108 and the gate-oxide material layer 106.

Figure 6B:
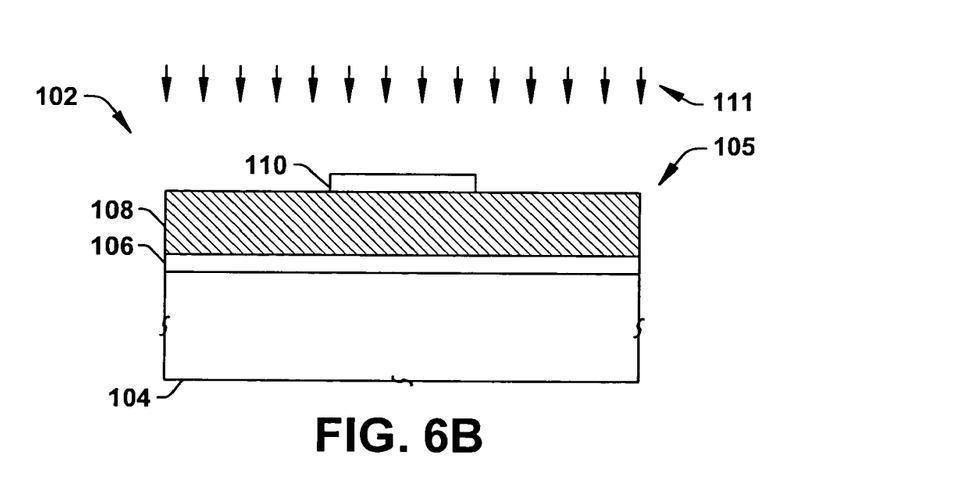

In FIG. 6B, the hard mask layer 110 is patterned using a photoresist and an anisotropic etch 111 into the gate stack 105.

Figure 6C:
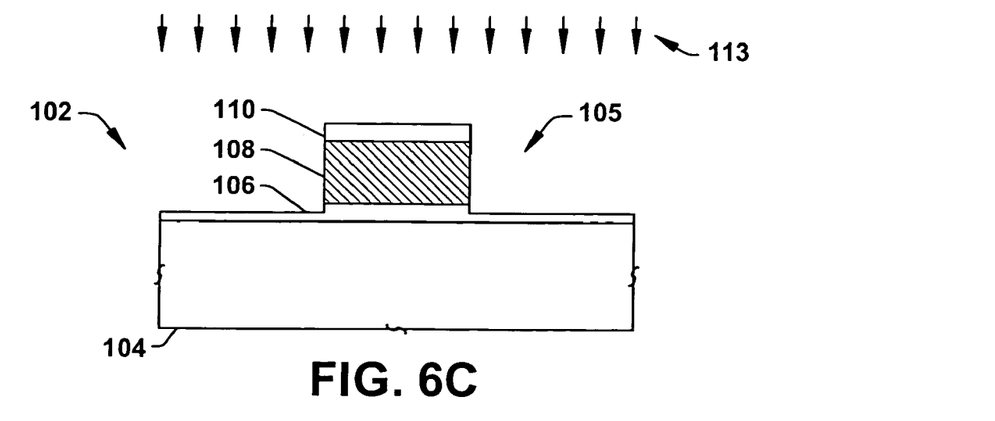

In FIG. 6C, the hard mask layer 110 now serves as a pattern for further formation of the gate stack 105 by performing an etch 113 through the polysilicon material layer 108 and partially into the gate-oxide layer 106 because of the silicon selectivity of the etch 113. Subsequently, the hard mask layer 110 is removed.

Figure 6D:
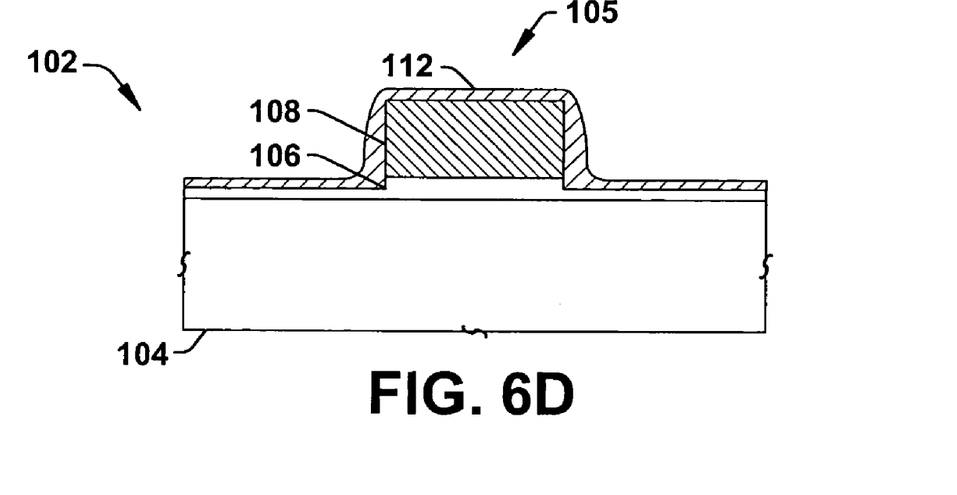
Figure 6E:
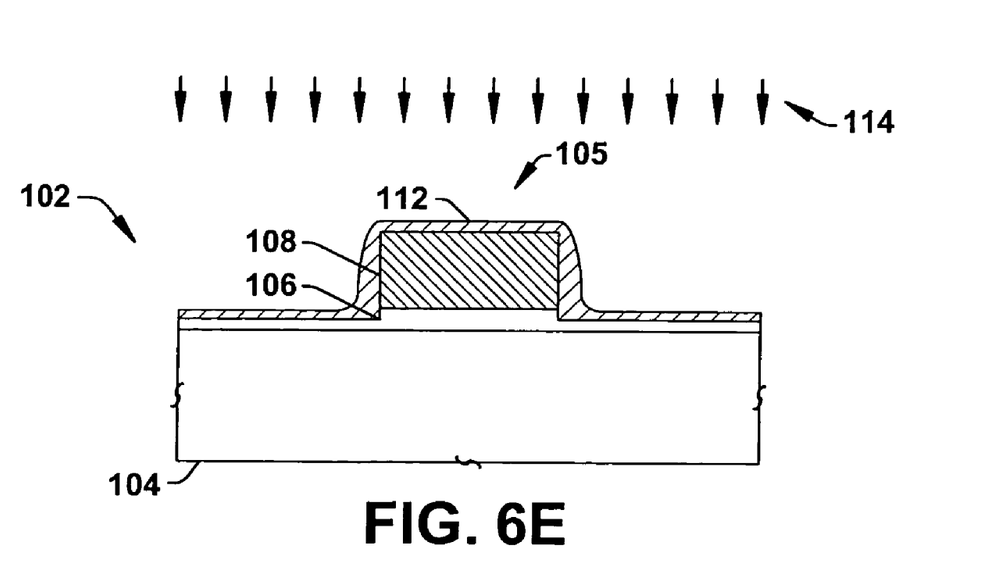
Figure 6F:
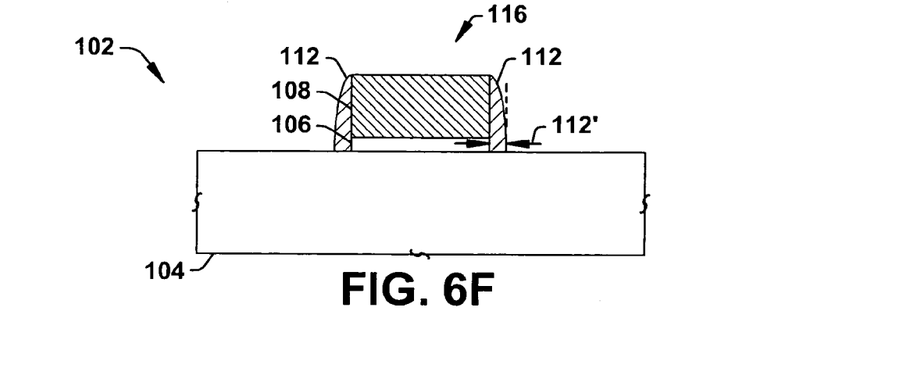

In FIG. 6D, an offset spacer 112 comprising, for example, an oxide material, is formed overlying the gate stack 105 and the remaining gate-oxide layer 106 overlying the semiconductor substrate 104. In FIG. 6E, performing an anisotropic etch 114 removes portions of the oxide material of the offset spacer 112 to expose the gate-oxide layer 106 and the semiconductor substrate 104, respectively. FIG. 6F illustrates the final shape of the offset spacer 112, and that of a gate structure 116 formed overlying the semiconductor substrate 104, resulting from the anisotropic etch 114 of FIG. 6E. FIG. 6F also shows that the offset spacer 112 is formed to a thickness 112' to aid in masking subsequent extension and deep S/D region dopant implantation.

Thus, to this point, a gate structure 116 is provided overlying a substrate 104, wherein drain extensions and deep source/drain regions of the MOS transistor 102 may be formed by implantation generally in accordance with the exemplary method 70 (act 72) illustrated and described above. Thereafter, in FIGS. 6G–6K, MOS transistor 102 is formed, generally in accordance with the exemplary method 70 (acts 74–88) also illustrated and described above.

Figure 6G:
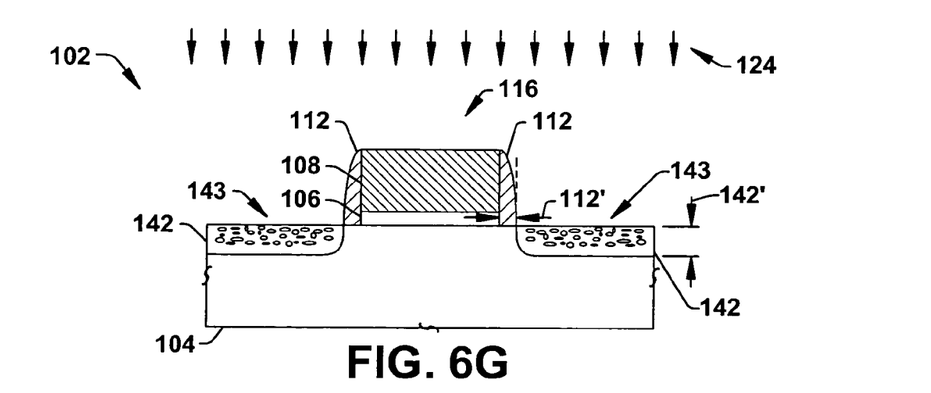
FIG. 6G is a partial side elevation view in section illustrating a preamorphization with Germanium and an implantation of boron in a source and drain extension region in the transistor of FIG. 6F.

In FIG. 6G, a preamorphization and doping implant 124 is performed on the semiconductor substrate 104 alongside the gate structure 116 of the MOS transistor 102. Although the preamorphization implant is discussed before the doping implant, either implantation may be accomplished first, wherein the implants may occur concurrently or sequentially in the present invention. In accordance with an aspect of the invention, the preamorphization implantation portion of process 124 comprises implanting a heavy ion species, for example, Ge, In, Sb, As, P, BF2, Si, Xe, Ar, or another amorphizing ion. The preamorphization implantation 124 is used to form a deep amorphized region 142 to a depth 142' in one or more drain extension regions 143 in the substrate 104.

In one example, the implanting of the heavy ion species deep into an extension region in the preamorphizing process 124 comprises an implantation dose of about 5E13 to 5E15 Ge/cm$^2$, such as about 8E13 to 5E15 Ge/cm$^2$, preferably about 2E14 Ge/cm$^2$. The heavy ion drain extension implantation 124, moreover, employs an implantation energy, for example, of about 50 keV to about 100 keV, such as about 45–80 keV, preferably about 70 keV.

The dopant implantation portion of implant process 124 comprises implanting the drain extensions 143 with a relatively shallow layer of a dopant species such as B (boron) or BF$_2$ (boron difluoride) for pMOS devices, for example, or another dopant species that exhibit an enhanced diffusion property in the amorphous phase. In one example, the exemplary dopant implantation process portion of 124 comprises an implantation dose of about 5E13 to 8E15 BF$_2$/cm$^2$, such as about 1E14 to 4E15 BF$_2$/cm$^2$, preferably about 1.4E15 BF$_2$/cm$^2$. The drain extensions 143, moreover employ an implantation energy of about 0.5 keV to about 10 keV, such as about 1–5 keV, preferably about 3 keV. If boron is used, the dose may be about 1E14 to about 4E15 B/cm$^2$, and an implantation energy of about 0.2 keV to about 2 keV, for example. Other implant concentrations, depths, gradients, and types of semiconductor devices are also anticipated within the scope of the present invention. The offset spacer 112 guides the implant 124 to space the implant away from the gate stack 105 by the thickness 112'.

Figure 6H:
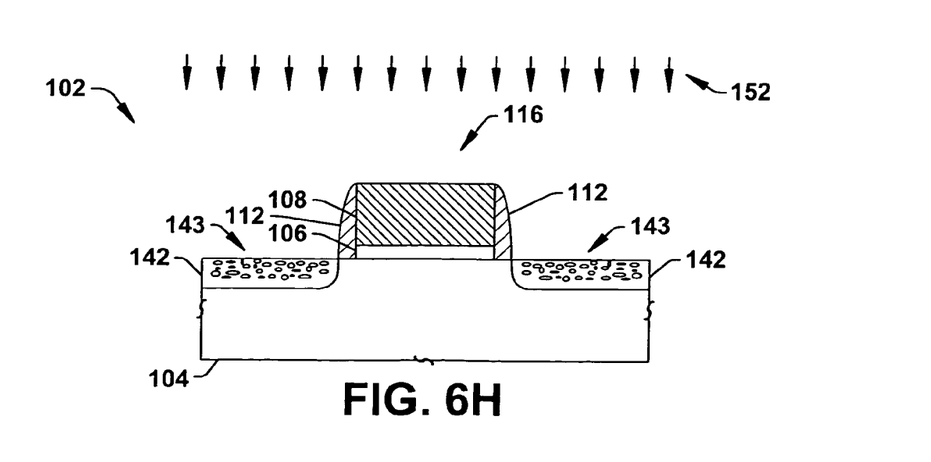
FIG. 6H is a partial side elevation view in section illustrating the device of FIGS. 6A–6G undergoing an optional low temperature preanneal (SPER) wherein the amorphous state relaxes but does not recrystallize in the drain extension regions in accordance with an aspect of the invention.

In FIG. 6H, an optional low temperature (LT) preanneal 152 may be performed on the deep amorphized region 142 following the preamorphization and doping implant 124. This optional LT preanneal 152 provides a temperature high enough to cause the amorphous state of the silicon to relax some, yet is maintained at a temperature and time product low enough to keep the silicon from recrystallizing. In one example, the LT preanneal 152 is performed at a temperature of, for example, about 400–450° C. for about 30 minutes. Other optional LT preanneal temperatures and times that provide amorphous state relaxation without recrystallization are also anticipated within the scope of the present invention.

Figure 6I:
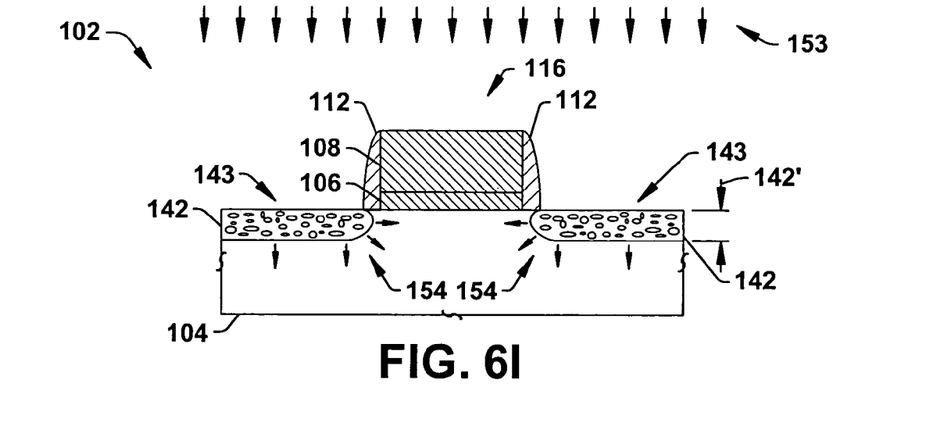
FIG. 6I is a partial side elevation view in section illustrating the device of FIGS. 6A–6H undergoing another optional low temperature preanneal (SPER) at a higher temperature, wherein a final doping concentration is achieved, and wherein the dopant diffuses slightly to achieve a final depth without recrystallization in accordance with an aspect of the invention.

In FIG. 6I, a low temperature (LT) preanneal 153 (or Pre-SPER) is performed on the dopant (e.g., B, BF$_2$, or other species in the case of a PMOS transistor) implanted in the drain extension regions at a temperature high enough to allow some diffusion downward to achieve an ideal dopant concentration and depth, and some diffusion laterally under the channel region. Such a low temperature preanneal further provides dopant diffusion without gradient profile degradation. The LT preanneal process is maintained at a temperature below the recrystallization temperature of the silicon substrate, for example, between about 400° C. to about 600° C. (e.g., preferably between about 450° C. to about 550° C.) for about 2 seconds to about 2 hours, and preferably about one hour. Other LT preanneal temperatures and times that provide adequate diffusion concentration and depth without recrystallization are also anticipated within the scope of the present invention.

Figure 6J:
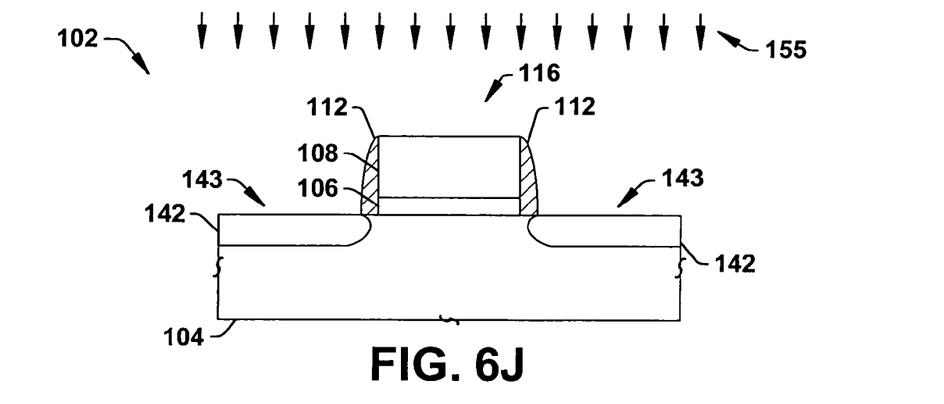
FIG. 6J is a partial side elevation view in section illustrating laser SPER annealing of the drain extensions within the transistor of FIG. 6I providing epitaxial recrystallization of the drain extensions while still in the solid phase.

Finally in FIG. 6J, a laser SPER anneal 155, utilizing a laser provides solid phase epitaxial recrystallization (SPER) of the drain extensions 143. Ideally, the drain extensions 143 are raised rapidly enough in the laser SPER anneal 155 to continue the SPER anneal to ultra-high temperature levels between about 1200° C. to about 1400° C., preferably about 1350° C. for about 1 ms or less.

Figure 6K:
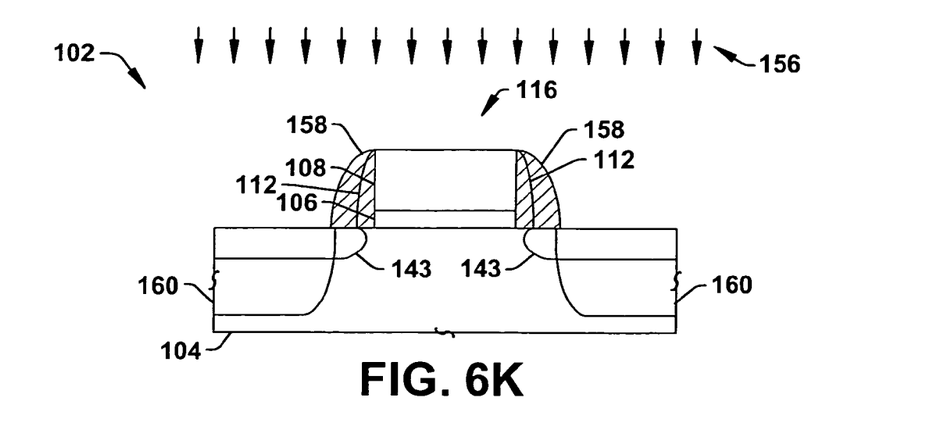
FIG. 6K is a partial side elevation view in section illustrating the transistor of FIG. 6J after formation of an offset spacer on both sides of the gate structure and source/drain regions, and subsequently undergoing an optional laser SPER annealing of the drain extensions and the deep source/drain regions processed in accordance with the invention.

Optionally thereafter, laser SPER anneal 155, and/or an additional laser SPER anneal 156 similar to anneal 155 may be accomplished after subsequent conventional back-end processing as illustrated by FIG. 6K and the method steps of FIGS. 5–6. For example, sidewall spacers 158 may be formed alongside the gate structure 116 to guide implantation of the deep source/drain regions 160 in the substrate 104 of transistor 102. Optionally, then, the laser SPER anneal 155, and/or the additional laser SPER anneal 156 may be done to concurrently provide solid phase epitaxial recrystallization (SPER) of both the drain extensions 143 and the deep S/D regions 160. Thereafter, other conventional back-end processing may include silicide and interconnect processing (not shown).

In this way, the drain extensions 143 are annealed to a crystalline state while still in the solid phase, in a thin, highly concentrated drain extension layer 143, formed at a high activation level, yet possessing the desired level of dopant diffusion. Further, such higher activation levels and solid phase epitaxy mitigate end-of-range damage characteristic of lower temperature final annealing processes and/or profile degradation.

Using preamorphization and dopant implantation, preannealing, and laser SPER annealing of a heavy ion and the boron dopant species examples, respectively, the present invention provides for higher level dopant concentrations in drain extensions and corresponding reduction in sheet resistance compared with conventional techniques.

It will be noted that the device 102 illustrated and described above, as well as the methods 70, 90, and 95 are exemplary in nature, and that many alternative orderings of various process steps may be made in accordance with the spirit and scope of the present invention. In addition, as pointed out above, the invention is not limited to pMOS device fabrication, and may be implemented in association with fabricating nMOS transistors as well. Moreover, the invention finds utility in association with the manufacture of memory devices, wherein the various aspects thereof may be applied in fabricating memory cells and the like.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of fabricating a drain extension in a MOS transistor, comprising:
    implanting a heavy ion species into an extension region of a substrate adjacent a channel region of the substrate to form an amorphized region;
    implanting a dopant species into the extension region of the substrate adjacent the channel region;
    annealing the implanted dopant species in the extension region to set a junction depth and doping concentration using a low temperature preanneal process at a temperature below a recrystallization temperature of the substrate; and
    annealing with a laser the extension region to activate the dopant species throughout substantially all of the drain extension region.

2. The method of claim 1, further comprising forming a gate structure over the channel region of the substrate before forming the amorphized region.

3. The method of claim 1, further comprising:
    forming a sidewall spacer around a gate structure over the channel region of the substrate; and
    implanting deep source and drain regions proximate the extension region before the laser anneal process.

4. The method of claim 1, wherein the heavy ion species comprises one of Ge, In, Sb, As, P, $BF_2$, Si, Xe, Ar.

5. The method of claim 1, wherein the dopant species comprises one of boron or another dopant species exhibiting an enhanced diffusivity property in an amorphous phase of silicon.

6. The method of claim 1, wherein the low temperature preanneal process comprises:
    a first low temperature anneal of about 450° C. to about 550° C. for about 30 minutes or less to relax an amorphous state of the substrate;
    a second low temperature anneal processed at a temperature above the first low temperature anneal, but below the recrystallization temperature of the substrate.

7. The method of claim 6, wherein the temperature of the second low temperature anneal is about 600° C. or less and about 500° C. or more for about 30 minutes or less.

8. The method of claim 1, wherein the low temperature preanneal process is performed at about 600° C. or less and about 500° C. or more for about 30 minutes or less.

9. The method of claim 1, wherein the low temperature preanneal process provides sufficient time and temperature below that of recrystallization of the substrate to provide diffusivity adjacent to and under the channel region of the MOS transistor.

10. The method of claim 1, wherein the laser anneal process is performed at about 1350° C. or less for about 1 ms.

11. The method of claim 1, wherein the heavy ion species and the dopant species are different.

12. The method of claim 11, wherein the heavy ion implantation comprises implanting Ge in the drain extension region using the preamorphizing process, and wherein implanting the dopant species comprises implanting boron in the drain extension region using the dopant implantation process.

13. The method of claim 1, wherein the laser anneal process is performed immediately following the implantation and the low temperature preanneal of the drain extension regions and following the implantation of the deep source and drain regions.

14. The method of claim 1, wherein the laser anneal process is performed immediately following one of the low temperature preanneal of the drain extension regions and the implantation of the deep source and drain regions.

15. The method of claim 1, wherein the implanting of the heavy ion species deep into an extension region comprises a germanium implantation dose of about 8E13 to about 5E15 $Ge/cm^2$ and an implantation energy of about 45 to about 80 keV.

16. The method of claim 15, wherein after the implanting of the heavy ion species, boron is implanted in the dopant implantation process comprising an implantation dose of about 1E14 to about 4E15 $BF_2/cm^2$, and an implantation energy of about 1 to about 5 keV.

17. The method of claim 15, wherein after the implanting of the heavy ion species, boron is implanted in the dopant implantation process comprising an implantation dose of about 1E14 to about 4E15 $B/cm^2$, and an implantation energy of about 0.2 keV to about 2 keV.

18. The method of claim 1, further comprising:
    forming a sidewall spacer around a gate structure over the channel region of the substrate after the laser anneal process;
    implanting deep source and drain regions; and
    annealing with a laser the extension region and the deep source and drain regions to activate the dopant species in the drain extension and the deep source and drain regions proximate the channel region using a second laser anneal process.

19. A method of fabricating a drain extension in a MOS transistor, comprising:
    implanting an amorphizing ion species into an extension region of a substrate adjacent a channel region of the substrate to form an amorphized region;
    implanting a dopant species into the extension region of the substrate;
    annealing the implanted dopant species in the extension region using a low temperature preanneal process at a temperature that is below a recrystallization temperature of the substrate; and
    annealing with a laser the extension region to activate the dopant species.

20. The method of claim 19, further comprising forming a gate structure over the channel region of the substrate before the amorphizing implant.

21. The method of claim 19, further comprising:
forming a sidewall spacer around a gate structure over the channel region of the substrate; and
implanting source and drain regions proximate the drain extension region before the laser anneal process; and
wherein the laser anneal accomplishes a solid phase epitaxial recrystallization of the extension region and the source and drain regions at a temperature of about 1350° c. a less for about 1 ms.

22. The method of claim 19, wherein the amorphizing ion species of the amorphizing implant comprises one of Ge, In, Sb, As, P, $BF_2$, Si, Xe, Ar.

23. The method of claim 19, wherein the implanting of the amorphizing ion species into the extension region comprises a germanium implantation dose of about 8E13 to about 5E15 $Ge/cm^2$ and an implantation energy of about 45 to about 80 keV.

24. The method of claim 19, wherein the dopant implantation comprises an implantation of boron or another dopant species exhibiting a concentration enhanced diffusivity property, implanted at a dose of about 1E14 to about 4E15 $BF_2/cm^2$, and an implantation energy of about 1 to about 5 keV.

25. The method of claim 19, wherein the dopant implantation comprises an implantation of boron or another dopant species exhibiting a concentration enhanced diffusivity property, implanted at a dose of about 1E14 to about 4E15 $B/cm^2$, and an implantation energy of about 0.2 keV to about 2 keV.

26. The method of claim 19, wherein the laser anneal process is performed immediately following the implantation and low temperature preannealing of the drain extensions and following the implantation of the source and drain regions.

27. The method of claim 19, wherein the laser anneal process is performed immediately following one of the low temperature preannealing of the drain extensions and the implantation of the source and drain regions.

28. The method of claim 19, wherein the amorphizing implant and the dopant implant are performed concurrently.

* * * * *